(12) United States Patent
Burgess et al.

(10) Patent No.: US 10,366,741 B2
(45) Date of Patent: Jul. 30, 2019

(54) BIT PROCESSING

(71) Applicant: ARM LIMITED, Cambridge (GB)

(72) Inventors: Neil Burgess, Cardiff (GB); Nigel John Stephens, Cambridge (GB); Lee Evan Eisen, Round Rock, TX (US); Jaime Ferragut Martinez-Vara De Rey, Cambridge (GB)

(73) Assignee: ARM Limited, Cambridge (GB)

( * ) Notice: Subject to any disclaimer, the term of this patent is extended or adjusted under 35 U.S.C. 154(b) by 120 days.

(21) Appl. No.: 15/711,116

(22) Filed: Sep. 21, 2017

(65) Prior Publication Data

US 2019/0088307 A1 Mar. 21, 2019

(51) Int. Cl.
*G11C 11/56* (2006.01)
*G11C 11/4094* (2006.01)

(52) U.S. Cl.
CPC ...... *G11C 11/4094* (2013.01); *G11C 11/5621* (2013.01)

(58) Field of Classification Search
None
See application file for complete search history.

(56) References Cited

U.S. PATENT DOCUMENTS 9,002,915 B1 * 4/2015 Young ............ H03K 19/17736
708/209

2015/0039662 A1 * 2/2015 Iyer ................. G06F 5/012
708/209

OTHER PUBLICATIONS

Y. Hilewitz et al., "Comparing Fast Implementations of Bit Permutation Instructions", *Asilomar Conference on Signals, Systems and Computers*, Nov. 2004, 8 pages.

* cited by examiner

*Primary Examiner* — Michael D. Yaary
(74) *Attorney, Agent, or Firm* — Nixon & Vanderhye P.C.

(57) ABSTRACT

Circuitry comprises: a set of bit processing circuitries to apply two or more successive instances of bitwise processing to an ordered bit array; each bit processing circuitry for a given bit position within the ordered bit array comprising: bit shifting circuitry to selectively apply a bit shift of a respective input bit to a next bit processing circuitry in a first direction relative to the ordered bit array, in response to an active state of a bit shift control signal, the bit shifting circuitry not applying the bit shift in response to an inactive state of the bit shift control signal; and bit shift control circuitry to selectively allow or inhibit a bit shifting operation in response to one or more inhibit control signals; in which: the bit shift control circuitry is configured to selectively propagate an output inhibit control signal, indicating that a bit shifting operation should be inhibited, as an inhibit control signal to bit processing circuitry applying a next instance of the bitwise processing at the given bit position, in dependence upon the bit shift control signal and the one or more inhibit control signals.

20 Claims, 9 Drawing Sheets

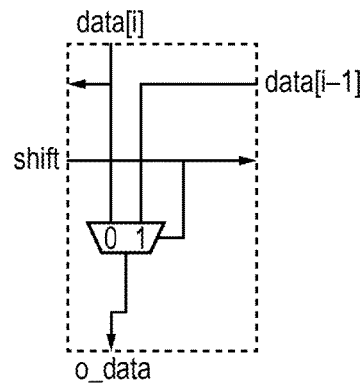
FIG. 4
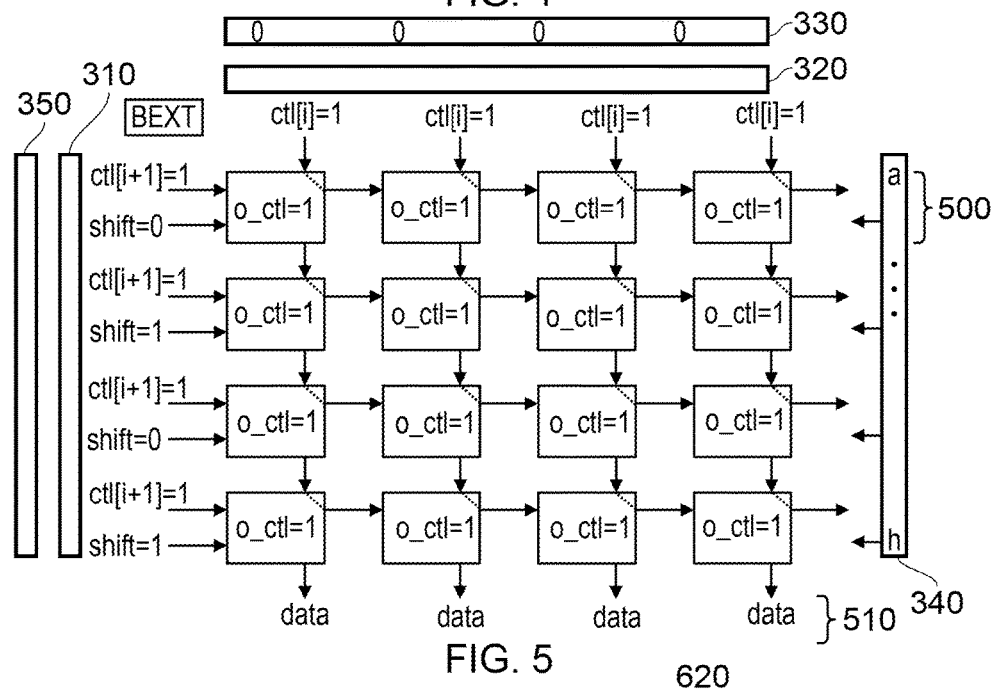
FIG. 5
| 600 | sieve[7:0] | data[7:0] | | | | | | | | operation |
|---|---|---|---|---|---|---|---|---|---|---|
| | 1 | 0 | 0 | 0 | 0 | 0 | 0 | 0 | a | shift left by 1 bit |
| | 1 | 0 | 0 | 0 | 0 | 0 | 0 | a | b | shift left by 1 bit |
| | 0 | 0 | 0 | 0 | 0 | 0 | 0 | a | b | do nothing |
| | 1 | 0 | 0 | 0 | 0 | 0 | a | b | d | shift left by 1 bit |
| | 0 | 0 | 0 | 0 | 0 | 0 | a | b | d | do nothing |
| | 0 | 0 | 0 | 0 | 0 | 0 | a | b | d | do nothing |
| 610 | 0 | 0 | 0 | 0 | 0 | 0 | a | b | d | do nothing |
| | 1 | 0 | 0 | 0 | 0 | a | b | d | h | shift left by 1 bit |
FIG. 6

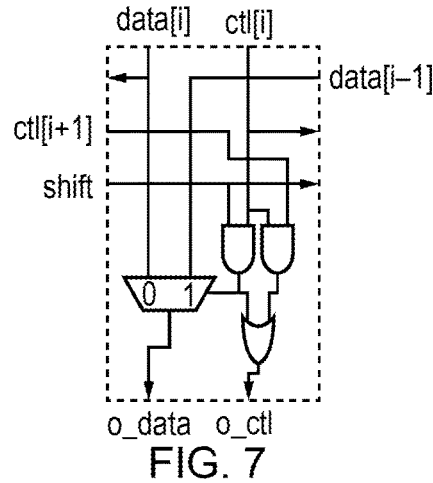
FIG. 7
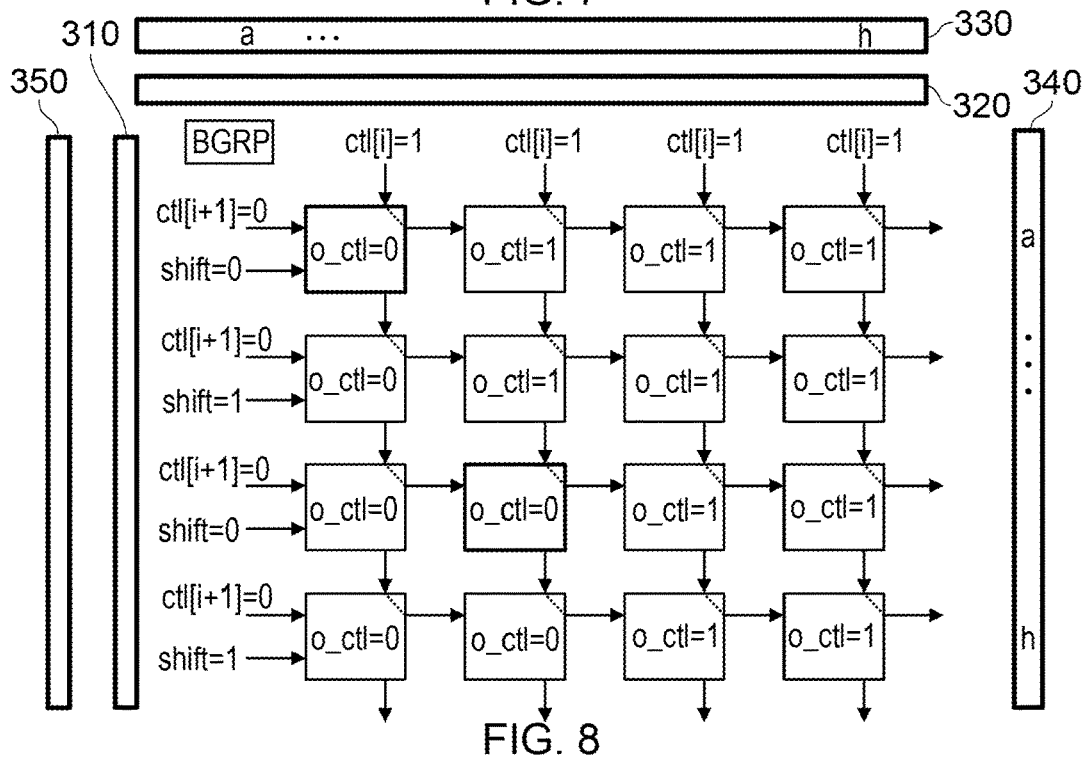
FIG. 8
FIG. 9

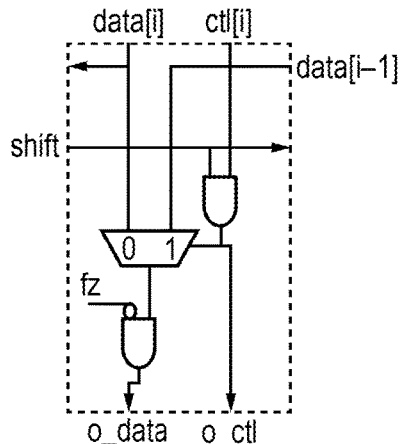
FIG. 10
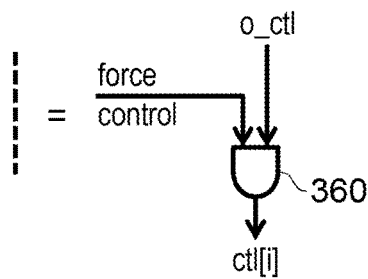
FIG. 11
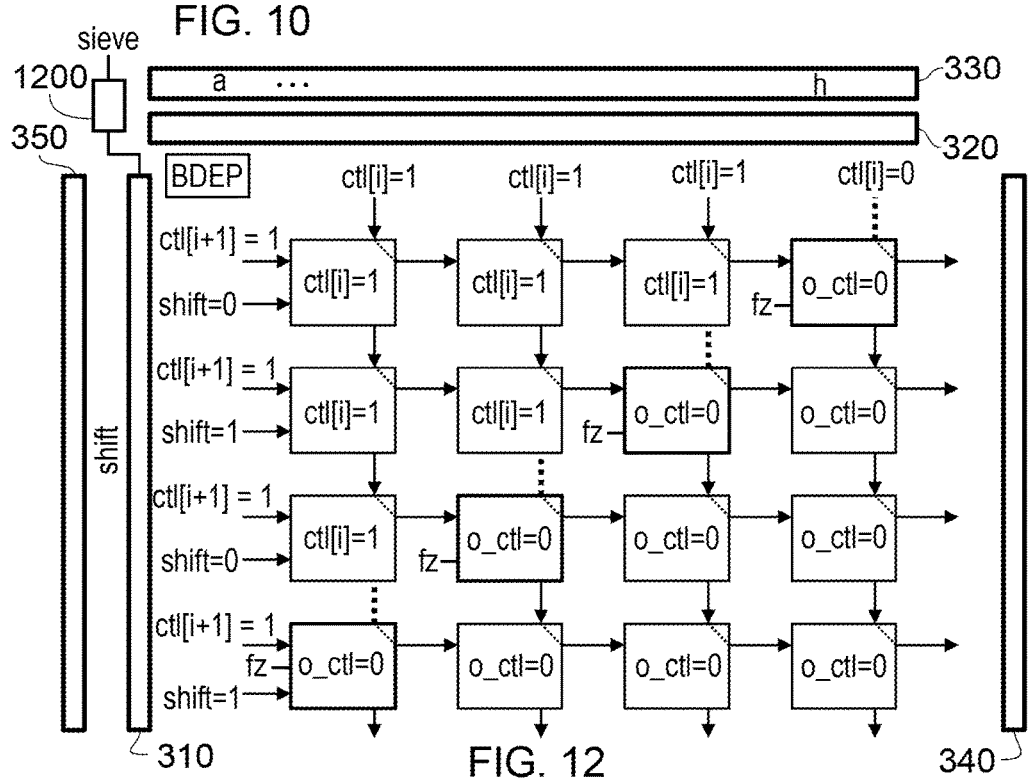
FIG. 12
| shift[7:0] | data[7:0] | | | | | | | | operation |
|---|---|---|---|---|---|---|---|---|---|
| 0 | a | b | c | d | e | f | g | h* | no shift, lock data[0] |
| 1 | b | c | d | e | f | g | 0* | h* | shift left, lock data[1] |
| 1 | c | d | e | f | g | 0* | 0* | h* | shift left, lock data[2] |
| 1 | d | e | f | g | 0* | 0* | 0* | h* | shift left, lock data[3] |
| 0 | d | e | f | g* | 0* | 0* | 0* | h* | no shift, lock data[4] |
| 1 | e | f | 0* | g* | 0* | 0* | 0* | h* | shift left, lock data[5] |
| 0 | e | f* | 0* | g* | 0* | 0* | 0* | h* | no shift, lock data[6] |
| 0 | e* | f* | 0* | g* | 0* | 0* | 0* | h* | no shift, lock data[7] |
FIG. 13

|       |         |        | o_ctl |      |      | fz   |      |      |
|-------|---------|--------|-------|------|------|------|------|------|
| shift | ctl[i+1]| ctl[i] | BEXT  | BGRP | BDEP | BEXT | BGRP | BDEP |
| 0     | 0       | 0      | X     | 0    | 0    | X    | 0    | 0    |
| 0     | 0       | 1      | X     | 0    | X    | X    | 0    | X    |
| 0     | 1       | 0      | X     | X    | 0    | X    | X    | 0    |
| 0     | 1       | 1      | 1     | 1    | 1    | 0    | 0    | 0    |
| 1     | 0       | 0      | X     | 0    | 0    | X    | 0    | 0    |
| 1     | 0       | 1      | X     | 1    | X    | X    | 0    | X    |
| 1     | 1       | 0      | X     | X    | 0    | X    | X    | 1    |
| 1     | 1       | 1      | 1     | 1    | 1    | 0    | 0    | 0    |
FIG. 15
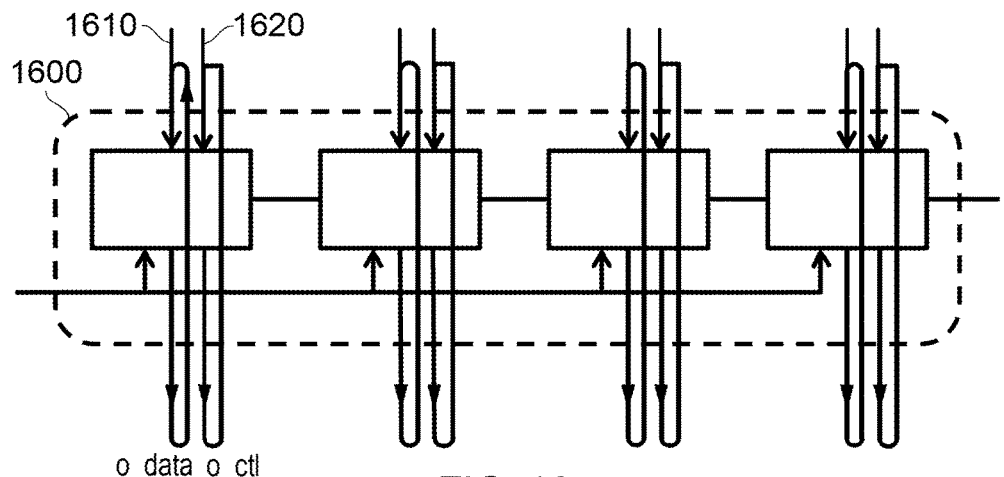
FIG. 16
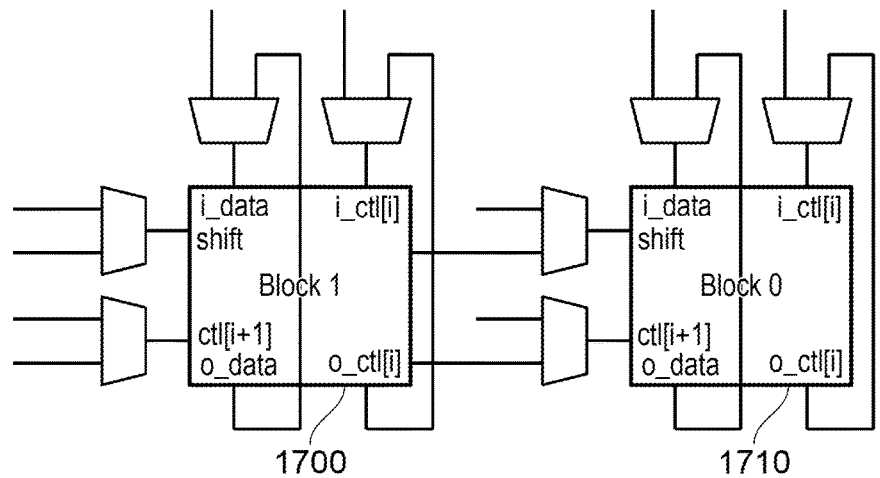
FIG. 17

BIT PROCESSING

BACKGROUND

This disclosure relates to bit processing.

Some bit processing involves so-called bit-level permutation instructions or operations in which bits of an input ordered bit array (such as an input word) are permuted to form an output ordered bit array according to values of control bits such as so-called sieve bits.

In previously proposed systems, the sieve needs to be analysed to determine how much each data bit must be shifted by (and in which direction) and an n-bit datapath comprising the equivalent of n n-to-1 multiplexers is needed to perform the shifting. Control circuitry in a previously proposed arrangement can be complicated and can lack flexibility, in that it is dedicated to a particular permutation operation.

SUMMARY

In an example arrangement there is provided circuitry comprising:

a set of bit processing circuitries to apply two or more successive instances of bitwise processing to an ordered bit array;

each bit processing circuitry for a given bit position within the ordered bit array comprising:

bit shifting circuitry to selectively apply a bit shift of a respective input bit to a next bit processing circuitry in a first direction relative to the ordered bit array, in response to an active state of a bit shift control signal, the bit shifting circuitry not applying the bit shift in response to an inactive state of the bit shift control signal; and bit shift control circuitry to selectively allow or inhibit a bit shifting operation in response to one or more inhibit control signals;

in which:

the bit shift control circuitry is configured to selectively propagate an output inhibit control signal, indicating that a bit shifting operation should be inhibited, as an inhibit control signal to bit processing circuitry applying a next instance of the bitwise processing at the given bit position, in dependence upon the bit shift control signal and the one or more inhibit control signals.

In another example arrangement there is provided circuitry comprising:

a set of bit processing means for applying two or more successive instances of bitwise processing to an ordered bit array;

each bit processing means for a given bit position within the ordered bit array comprising:

bit shifting means for selectively applying a bit shift of a respective input bit to a next bit processing means in a first direction relative to the ordered bit array, in response to an active state of a bit shift control signal, the bit shifting means not applying the bit shift in response to an inactive state of the bit shift control signal; and bit shift control means to selectively allow or inhibit a bit shifting operation in response to one or more inhibit control signals;

in which:

the bit shift control means is configured to selectively propagate an output inhibit control signal, indicating that a bit shifting operation should be inhibited, as an inhibit control signal to bit processing means applying a next instance of the bitwise processing at the given bit position, in dependence upon the bit shift control signal and the one or more inhibit control signals.

In another example arrangement there is provided a method comprising:

applying, using a set of bit processing circuitries, two or more successive instances of bitwise processing to an ordered bit array;

for a given bit position within the ordered bit array, each bit processing circuitry:

selectively applying a bit shift of a respective input bit to a next bit processing circuitry in a first direction relative to the ordered bit array, in response to an active state of a bit shift control signal and not applying the bit shift in response to an inactive state of the bit shift control signal;

selectively allowing or inhibiting a bit shifting operation in response to one or more inhibit control signals; and selectively propagating an output inhibit control signal, indicating that a bit shifting operation should be inhibited, as an inhibit control signal to bit processing circuitry applying a next instance of the bitwise processing at the given bit position, in dependence upon the bit shift control signal and the one or more inhibit control signals.

Further respective aspects and features of the present technology are defined by the appended claims.

BRIEF DESCRIPTION OF THE DRAWINGS

The present technique will be described further, by way of example only, with reference to embodiments thereof as illustrated in the accompanying drawings, in which:

FIG. 4 schematically illustrates components contributing to a first permutation function;

FIG. 5 schematically illustrates a set of bit processing circuitries to perform the first permutation function;

FIG. 6 is a table schematically illustrating the operation of the first permutation function;

FIG. 7 schematically illustrates components contributing to a second permutation function;

FIG. 8 schematically illustrates a set of bit processing circuitries to perform the second permutation function;

FIG. 9 is a table schematically illustrating the operation of the second permutation function;

FIG. 10 schematically illustrates components contributing to a third permutation function;

FIG. 11 schematically illustrates force control logic;

FIG. 12 schematically illustrates a set of bit processing circuitries to perform the third permutation function;

FIG. 13 is a table schematically illustrating the operation of the third permutation function;

FIG. 15 is a table schematically illustrating valid data values;

FIGS. 16 and 17 schematically illustrate bit processing circuitries providing more than one instance of bitwise processing.

DESCRIPTION OF EMBODIMENTS

Figure 1:
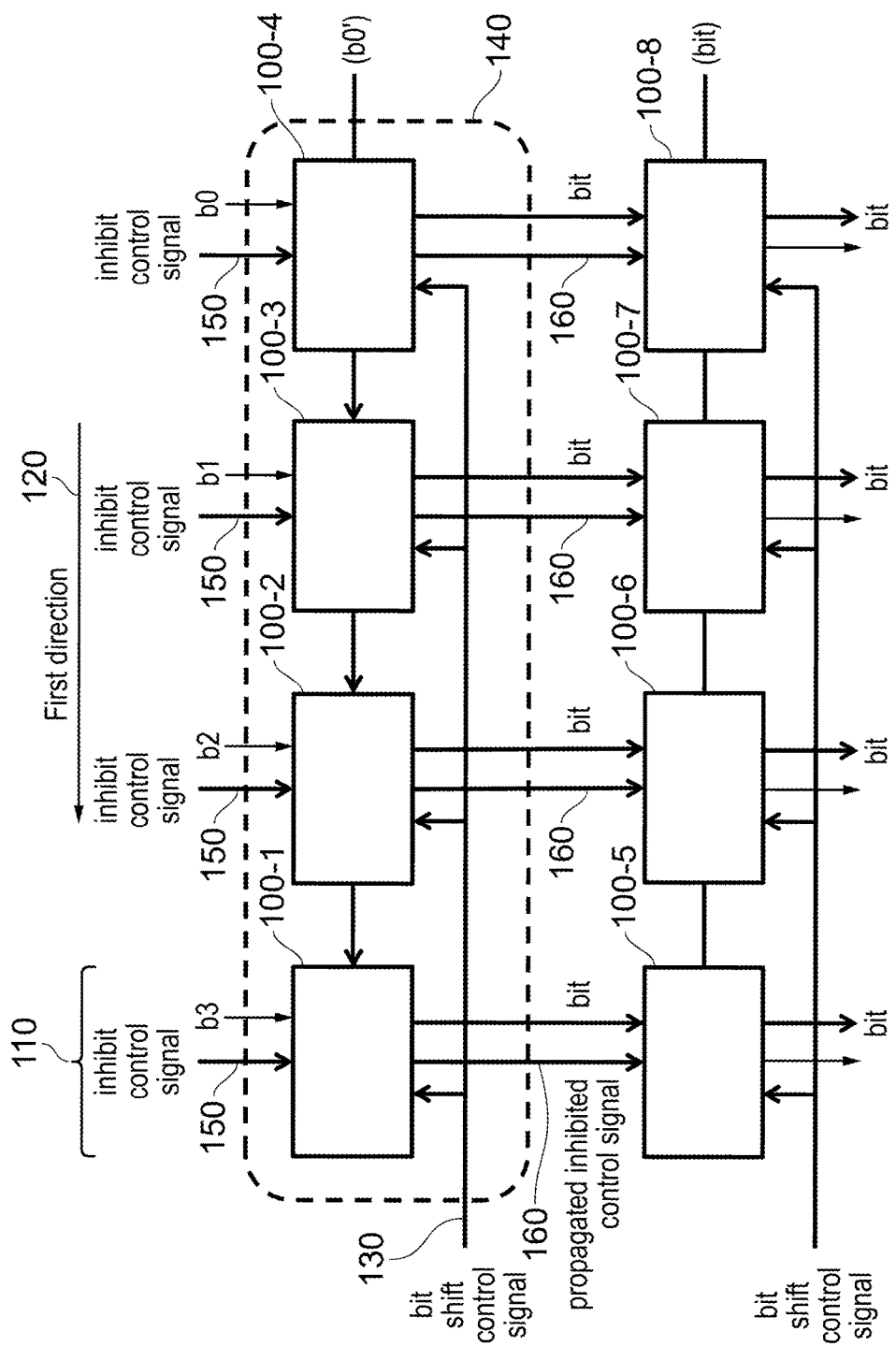
FIG. 1 schematically illustrates example circuitry.

Before discussing the embodiments with reference to the accompanying figures, the following description of embodiments is provided.

An example embodiment provides circuitry comprising:

a set of bit processing circuitries to apply two or more successive instances of bitwise processing to an ordered bit array;

each bit processing circuitry for a given bit position within the ordered bit array comprising:

bit shifting circuitry to selectively apply a bit shift of a respective input bit to a next bit processing circuitry in a first direction relative to the ordered bit array, in response to an active state of a bit shift control signal, the bit shifting circuitry not applying the bit shift in response to an inactive state of the bit shift control signal; and bit shift control circuitry to selectively allow or inhibit a bit shifting operation in response to one or more inhibit control signals;

in which:

the bit shift control circuitry is configured to selectively propagate an output inhibit control signal, indicating that a bit shifting operation should be inhibited, as an inhibit control signal to bit processing circuitry applying a next instance of the bitwise processing at the given bit position, in dependence upon the bit shift control signal and the one or more inhibit control signals.

The present disclosure provides circuitry formed of a set of bit processing circuitries, which may in fact be identical to one another in example embodiments, having a controllable bit shifting function and a shift inhibit function which can selectively propagate between bit processing circuitries. This arrangement advantageously allows various functions such as, for example, bit permutation functions, to be carried out using a common set of bit processing circuitries.

A convenient way of controlling inhibit functions and allowing inhibit signals to be propagated between bit processing circuitries is one in which the one or more inhibit control signals comprise: a first inhibit control signal, the bit shift control circuitry being configured to inhibit bit shifting by the bit shifting circuitry and to propagate the output inhibit control signal, indicating that a bit shifting operation should be inhibited, when the first inhibit control signal indicates that a bit shifting operation should be inhibited; and a second inhibit control signal, the bit shift control circuitry being configured to propagate the output inhibit control signal, indicating that a bit shifting operation should be inhibited, when the second inhibit control signal indicates that a bit shifting operation should be inhibited and the bit shift control signal is inactive. In example arrangements the second inhibit control signal is dependent upon the first inhibit control signal of another bit shifting circuitry for a bit position adjacent, in a second direction relative to the ordered bit array, to the given bit position. For example the second direction may be an opposite direction, relative to the ordered bit array, to the first direction.

For implementing a given instance of bitwise processing, in example arrangements the set of bit shifting circuitries comprises: a series of bit shifting circuitries to apply a given instance of bitwise processing, the series of bit shifting circuitries being responsive to a common bit shift control signal applicable to the given instance of bitwise processing.

In order that more than one instance of bitwise processing can be performed by a single series of bit processing circuitries, which can potentially reduce the number of components needed to implement the technique, in some examples the circuitry comprises circuitry to link an output of a given series of bit processing circuitries to an input of the given series of bit processing circuitries, so as to control the given series of bit processing circuitries to provide two or more instances of bitwise processing. At one extreme, all of the instances of bitwise processing could be performed by a single series, using this technique. Other arrangements however comprise two or more successive series of bit processing circuitries. So at another extreme, n successive series of bit processing circuitries can be used to perform n successive instances of bitwise processing.

In some examples, the ordered bit array comprises an n-bit array (where n might be an integer equal to one or more, for example 4, 8, 16, 32, 64 or the like, though it is not a requirement that powers of two are used); the circuitry provides n successive instances of bitwise processing; and the circuitry is responsive to an n-bit shift control bit array, in which a respective bit of the n-bit shift control bit array provides a bit shift control signal to a respective instance of bitwise processing.

A convenient way of implementing the bit shifting function is one in which each bit processing circuitry for a given bit position in the ordered bit array comprises: a first bit input; a second bit input; and a bit output, to output either a bit received at the first bit input, in the case that a bit shift is not performed, or a bit received at the second bit input, in the case that a bit shift is performed. For example, for each given bit processing circuitry other than a bit processing circuitry earliest in the series in the first direction, a bit at the second bit input is dependent upon a bit at the first bit input of an adjacent bit processing circuitry earlier in the series in the first direction. For example, for an instance of bitwise processing other than a first instance of bitwise processing, the first bit input for a bit processing circuitry at a given bit position is configured to receive a bit output by a bit processing circuitry at the given bit position applying a previous instance of bitwise processing.

Example arrangements allow an array of set of bit processing circuitries to be configured for different example functionality, for example by providing a first data input configured to provide respective bits of a first input ordered bit array to respective first inputs of bit processing circuitries earliest in the first direction applying respective instances of bitwise processing; and a second data input configured to provide respective bits of a second input ordered bit array to respective first inputs of a series of bit processing circuitries applying a first instance of bitwise processing.

For an example bit permutation function, the first input ordered bit array comprises an n-bit input ordered bit array; the second input ordered bit array comprises an array of bits of a predetermined value; the one or more inhibit control signals supplied to each bit processing circuitry comprise signals indicating that shifting should be allowed; and the circuitry is configured to generate an n-bit output ordered bit array in which bits of the n-bit input ordered bit array at bit positions of active bits of the n-bit shift control bit array are provided, starting from an earliest bit position in the n-bit output ordered bit array.

For another example bit permutation function, a third control input is provided, to provide respective bits of a third input ordered bit array to provide respective second inhibit control signals to bit processing circuitries earliest in the second direction applying respective instances of bitwise processing; the first input ordered bit array and the second input ordered bit array comprise a common n-bit input ordered bit array; the third ordered bit array comprises an array of bits indicating that shifting should be inhibited; and the circuitry performs a function of generating an n-bit output ordered bit array in which bits of the common n-bit input ordered bit array at bit positions of active bits of the n-bit shift control bit array are provided, starting from an earliest bit position in the n-bit output ordered bit array in the first direction, followed in the first direction by remaining bits of the common n-bit input ordered bit array.

For another example bit permutation function, control circuitry provides respective first inhibit control signals, to indicate that bit shifting should be inhibited, to a bit processing circuitry at a selected position for each instance of bitwise processing, the selected position advancing in the second direction between the successive instances of bitwise processing; and the second input ordered bit array comprises an n-bit input ordered bit array. In such arrangements, it can be the case that the circuitry provides generator circuitry to generate the n-bit shift control bit array by inverting and bit-reversing an n-bit function control bit array; and processing circuitry to generate an output n-bit ordered bit array by setting any output bits to a first predetermined value at bit positions for which a bit of the n-bit function control bit array is inactive; the circuitry being configured to generate the output n-bit ordered bit array in which: bits of the n-bit input ordered bit array at bit positions of active bits of the n-bit function control bit array are provided, starting from an earliest bit position in the n-bit input ordered bit array; and other bits of the output n-bit ordered bit array are set to the first predetermined value.

In example arrangements, each of the bit permutation functions discussed above can be achieved by a common set of bit processing circuitries. In examples, the bit processing circuitries are identical to one another.

Another example embodiment provides circuitry comprising:

a set of bit processing means for applying two or more successive instances of bitwise processing to an ordered bit array;

each bit processing means for a given bit position within the ordered bit array comprising:

bit shifting means for selectively applying a bit shift of a respective input bit to a next bit processing means in a first direction relative to the ordered bit array, in response to an active state of a bit shift control signal, the bit shifting means not applying the bit shift in response to an inactive state of the bit shift control signal; and bit shift control means to selectively allow or inhibit a bit shifting operation in response to one or more inhibit control signals;

in which:

the bit shift control means is configured to selectively propagate an output inhibit control signal, indicating that a bit shifting operation should be inhibited, as an inhibit control signal to bit processing means applying a next instance of the bitwise processing at the given bit position, in dependence upon the bit shift control signal and the one or more inhibit control signals.

Another example embodiment provides a method comprising:

applying, using a set of bit processing circuitries, two or more successive instances of bitwise processing to an ordered bit array;

for a given bit position within the ordered bit array, each bit processing circuitry:

selectively applying a bit shift of a respective input bit to a next bit processing circuitry in a first direction relative to the ordered bit array, in response to an active state of a bit shift control signal and not applying the bit shift in response to an inactive state of the bit shift control signal;

selectively allowing or inhibiting a bit shifting operation in response to one or more inhibit control signals; and selectively propagating an output inhibit control signal, indicating that a bit shifting operation should be inhibited, as an inhibit control signal to bit processing circuitry applying a next instance of the bitwise processing at the given bit position, in dependence upon the bit shift control signal and the one or more inhibit control signals.

Referring now to the drawings, FIG. 1 schematically illustrates circuitry for performing bitwise processing on an ordered bit array.

The circuitry of FIG. 1 comprises a set of bit processing circuitries 100-1 . . . 100-8. In the example of FIG. 1, eight bit processing circuitries are shown but it will become clear from the discussion below that various numbers of bit processing circuitries could be implemented according to the required functionality. In the present example, the bit processing circuitries 100-1 . . . 100-8 are all identical to one another.

Each bit processing circuitry acts with respect to a given bit position, such as a bit position 110, within the ordered bit array. That is to say, as drawn in FIG. 1, the ordered bit array extends in a horizontal direction with respect to the drawing. Therefore, each given bit position within the ordered bit array is represented by a vertical column as drawn. The bit positions may, for example, be represented by a least significant bit position being drawn as a column at the right hand side of the diagram, with bit positions becoming more significant on moving towards the left hand side of the diagram (which is to say, in a first direction 120—discussed below).

Each of the bit processing circuitries 100-1 . . . 100-8 comprises bit shifting circuitry (not shown in FIG. 1 but described in more detail below) which selectively applies a bit shift of a respective input bit to a next bit processing circuitry in the first direction 120 relative to the ordered bit array. That is to say, in the example, a so-called left shift or a shift towards more significance is implemented. This shift is carried out in response to an active state of a bit shift control signal 130. In other words, a bit processing circuitry does not apply the bit shift in response to an inactive state of the bit shift control signal.

In the example of FIG. 1, a common bit shift control signal is supplied to the bit processing circuitries 100-1 . . . 100-4, and another common bit shift control signal is provided to the bit processing circuitries 100-5 . . . 100-8.

The set of bit processing circuitries 100-1 . . . 100-4 in FIG. 1 implement an "instance" or stage 140 of bitwise processing to the ordered bit array. That is to say, they together act on an n-bit ordered array, before passing the results of the processing to a next instance of bitwise processing. Similarly, the bit processing circuitries 100-5 . . . 100-8 implement another instance of bitwise processing to the ordered bit array. In this way, the set of bit processing circuitries of FIG. 1 is arranged to apply two or more successive instances of the bitwise processing.

Each bit processing circuitry also comprises bit shift control circuitry (not shown in detail in FIG. 1, but to be described later) which selectively allows or inhibits a bit shifting operation in response to one or more inhibit control signals. An example of an inhibit control signal is shown as a signal 150 provided to each bit processing circuitry 100-1 . . . 100-4 of the first instance 140 of bitwise processing. Other examples of inhibit control signals will be discussed below. The bit processing circuitries 100-1 . . . 100-8, and in particular the bit shift control circuitry of each bit processing circuitry, are configured to selectively propagate an output inhibit control signal 160, indicating that a bit shifting operation should be inhibited, as a inhibit control signal to bit processing circuitry applied a next instance of the bitwise processing at the given bit position, independence upon the bit shift control signal 130 and the one or more inhibit control signals 150.

So, in the example of FIG. 1, the bit processing circuitry 100-1 propagates a propagated inhibit control signal 160 to the bit processing circuitry 100-5, in dependence upon the inhibit control signal 150 processed by the processing circuitry 100-1 and the bit shift control signal 130 processed by the inhibit control signal 100-1.

It will be understood that in the context of a set of identical bit processing circuitries, those arranged to provide the last instance of bitwise processing (for example, in the simplified example of FIG. 1, the bit processing circuitries 100-5 . . . 100-8) may still generate a propagated inhibit control signal but may not necessarily have a "next" instance as a destination for that propagated inhibit control signal.

In respect of a particular instance of bitwise processing, the number of bit processing circuitries is not limited to four as shown in the example of FIG. 1, but can, for example, represent one bit processing circuitry for each bit of the bitwise processing to be applied to the ordered bit array. Similarly, the number of successive instances is not limited to two as shown in the schematic example of FIG. 1.

Also, using techniques to be discussed below, it is not a requirement that a series of bit processing circuitries (such as a series 100-1 . . . 100-4) is provided for every instance of bitwise processing; in some examples, output signals from a given series of bit processing circuitries could be linked, by linking circuitry, to an input of a series of bit processing circuitries, so as to control a given series (or row, as drawn schematically in FIG. 1) of bit processing circuitries to provide two or more instances of bitwise processing. Examples of such techniques will be discussed below. However, in other examples, two or more successive series of bit processing circuitries are provided, for example as shown in FIG. 1. In further examples, n successive series of bit processing circuitries are provided to perform n successive instances of bitwise processing.

Figure 2:
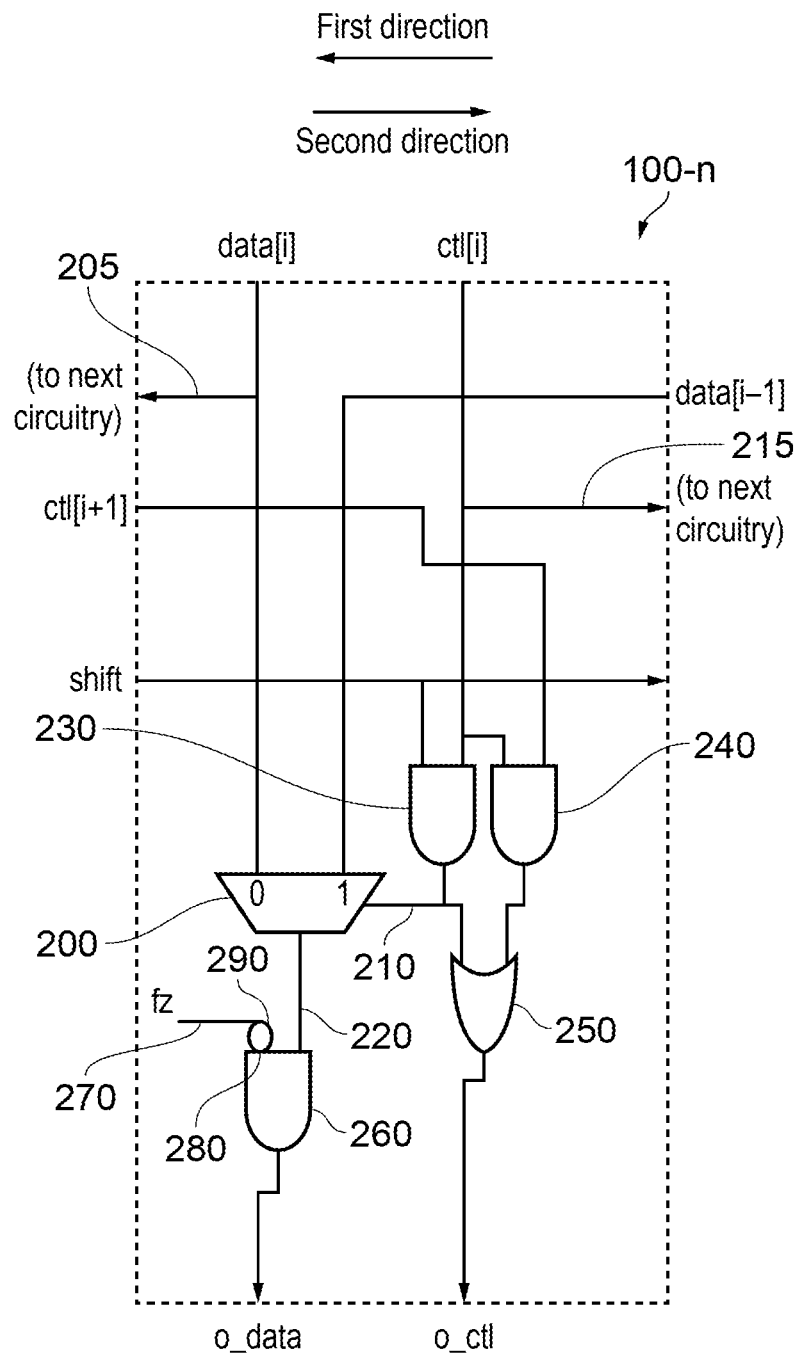
FIG. 2 schematically illustrates a bit processing circuitry.

FIG. 2 is a schematic example of a bit processing circuitry 100-*n*.

Bit shifting is performed by a multiplexer 200 which receives as inputs: a signal data [i] representing a data bit at the bit position, with respect to the ordered bit array, of the bit processing circuitry, and data [i−1] representing a bit at a preceding or earlier position, in the first direction 120, in the ordered bit array. (The signal data [i] is output on an output 215 to act as a version of "data [i−1]" the next-earlier circuitry in the first direction).

The multiplexer operates under the control of a control signal 210, such that (in this schematic example) if the control signal 210 is a 0, the data [i] is selected as an output 220 of the multiplexer 200, and if the signal 210 is a 1, the data [i−1] signal is selected as the output 220 of the multiplexer 200. So, given that data [i−1] represents a data bit from one bit position to the right (as drawn), the multiplexer 200 provides an example of bit shifting circuitry.

In other words, each bit processing circuitry for a given bit position in the ordered bit array comprises a first bit input data [i]; a second bit input data [i−1]; and a bit output o_data, to output either a bit received at the first bit input, in the case that a bit shift is not performed, or a bit received at the second bit input, in the case that a bit shift is performed. For each given bit processing circuitry other than a bit processing circuitry earliest in the series in the first direction, a bit at the second bit input is dependent upon a bit at the first bit input of an adjacent bit processing circuitry earlier in the series in the first direction. For an instance of bitwise processing other than a first instance of bitwise processing, the first bit input for a bit processing circuitry at a given bit position is configured to receive a bit output by a bit processing circuitry at the given bit position applying a previous instance of bitwise processing.

Bit shift control circuitry is provided by a pair of AND gates 230, 240 and an OR gate 250.

The AND gate 230 receives as inputs a "shift" signal representing an example of the bit shift control signal 130, and a control signal ctl [i] representing an example of the inhibit control signal 150 (a "first" inhibit control signal in the context of the later description). If both of these are set to a 1, then the output of the AND gate 230 is also a 1 and shifting takes place by the multiplexer 200 as discussed above.

The AND gate 240 receives as inputs the inhibit control signal ctl [i] and also a second inhibit control signal ctl [i+1] which represents a version of the control signal ctl [i] applicable to a next-earlier bit processing circuitry in a second direction, for example where the second direction is an opposite direction, relative to the ordered bit array, to the first direction. In other words, ctl [i+1], the second inhibit control signal, is dependent upon the first inhibit control signal of another bit shifting circuitry for a bit position adjacent, in a second direction relative to the ordered bit array, to the given bit position. If both ctl [i] and ctl [i+1] are set to 1, then the output of the AND gate 240 is a 1.

The control signal ctl [i] is output at an output 205 to provide a version of "ctl [i+1]" for use by the next-following circuitry in the first direction.

So, bit shifting takes place only if the bit shift control signal ("shift") is a 1 and the inhibit control signal ctl [i] is also 1. As mentioned above, in an example embodiment, the bit shift control signal is common to all bit processing circuitries in a particular instance of bitwise processing (a particular row as drawn schematically in FIG. 1) so that the same value of the bit shift control signal is provided to all of the bit processing circuitries in that instance. In other words, a series of bit shifting circuitries can apply a given instance of bitwise processing, the series of bit shifting circuitries being responsive to a common bit shift control signal applicable to the given instance of bitwise processing. However, the inhibit control signal ctl [i] is individual to bit processing circuitries in the instance. So, the bit shift control signal may be set to 1, indicating that a shift operation should take place for a particular instance or row, but if the inhibit control signal ctl [i] is a 0 for a particular bit processing circuitry in that instance, that particular bit processing circuitry will not implement the shift operation indicated by the bit shift control signal.

The OR gate 250 generates an output signal o_ctl which is propagated (as a propagated inhibit control signal) to a bit processing circuitry at the same bit position but which provides the next instance of bitwise processing, as the inhibit control signal ctl [i] for that next bit processing circuitry. The OR gate 250 outputs a value of 1 for o_ctl if either or both of the outputs of the AND gate 230, 240 are set to 1. This leads to various conditions applying to this output.

For example, if the value of ctl [i] for the present bit processing circuitry is a 0 (inhibit shifting), then both AND gates 230, 240 will output zeros and 0_ctl will also be 0. In this way, the signal ctl [i] acts as an example of a first inhibit control signal, the bit shift control circuitry 230, 240, 250 being configured to inhibit bit shifting by the bit shifting circuitry 200 (by virtue of the output of the AND gate 230 being forced to 0 irrespective of the state of the bit shift control signal) and to propagate the output inhibit control signal o_ctl indicating (by a value of 0 in this example) that a bit shifting operation should be inhibited, whenever the first inhibit control signal ctl [i] indicates (by a value of 0) that a bit shifting operation should be inhibited.

In other words, at a given bit position in the set of bit processing circuitries, once the signal ctl [i] has been set to 0 to inhibit bit shifting, each bit processing circuitry in each successive instance of bitwise processing at that given bit position will be inhibited from bit shifting.

This feature may be referred to as "locking" that bit position.

Another circumstance in which the propagated inhibit control signal o_ctl can be set to 0 is as follows.

If ctl [i+1], representing a second inhibit control signal (and provided by the value of ctl [i] corresponding to the next-earlier bit processing circuitry in the second direction) is set to 0 and the bit shift control signal ("shift") is also set to 0, then the outputs of both of the AND gates 230, 240 will be 0, shifting will not take place (because the bit shift control signal is set to 0) and the output of the OR gate 250 will generate an o_ctl value of 0.

In other words, if shifting is not taking place in that instance of bitwise processing and the bit processing circuitry to the left (as drawn in FIG. 1) has its first inhibit control signal set to 0, then the propagated inhibit control signal o_ctl will be set to 0.

If the second inhibit control signal indicates that a bit shifting operation should be inhibited (ctl [i+1]=0) and the bit shift control signal is inactive shift=0), then the propagated inhibit control signal o_ctl will be set to 0.

Of course, if both of these conditions arise, o_ctl will still be set to 0. That is to say, if ctl [i]=0 and ctl [i+1]=0 and shift=0, then o_ctl will still be 0.

A data output o_data basically represents the output 220 of the multiplexer 200. Optionally, a further AND gate 260 may be provided, taking the signal 220 as one input and an inversion of a "force zero" (fz) signal 270 as its other input. The force zero signal has the effect of causing the propagated bit value o_data to be 0 if the respective second input 280 of the AND gate 260 is a 0-which, assuming the inversion 290 is in use, will occur if fz=1. (The inversion is optional and merely allows a particular convenient polarity of the fz signal to be used). So if, in the circuitry of FIG. 2, fz=1, then o_data is 0 irrespective of the state of data [i], data [i−1] or shift.

Figure 3:
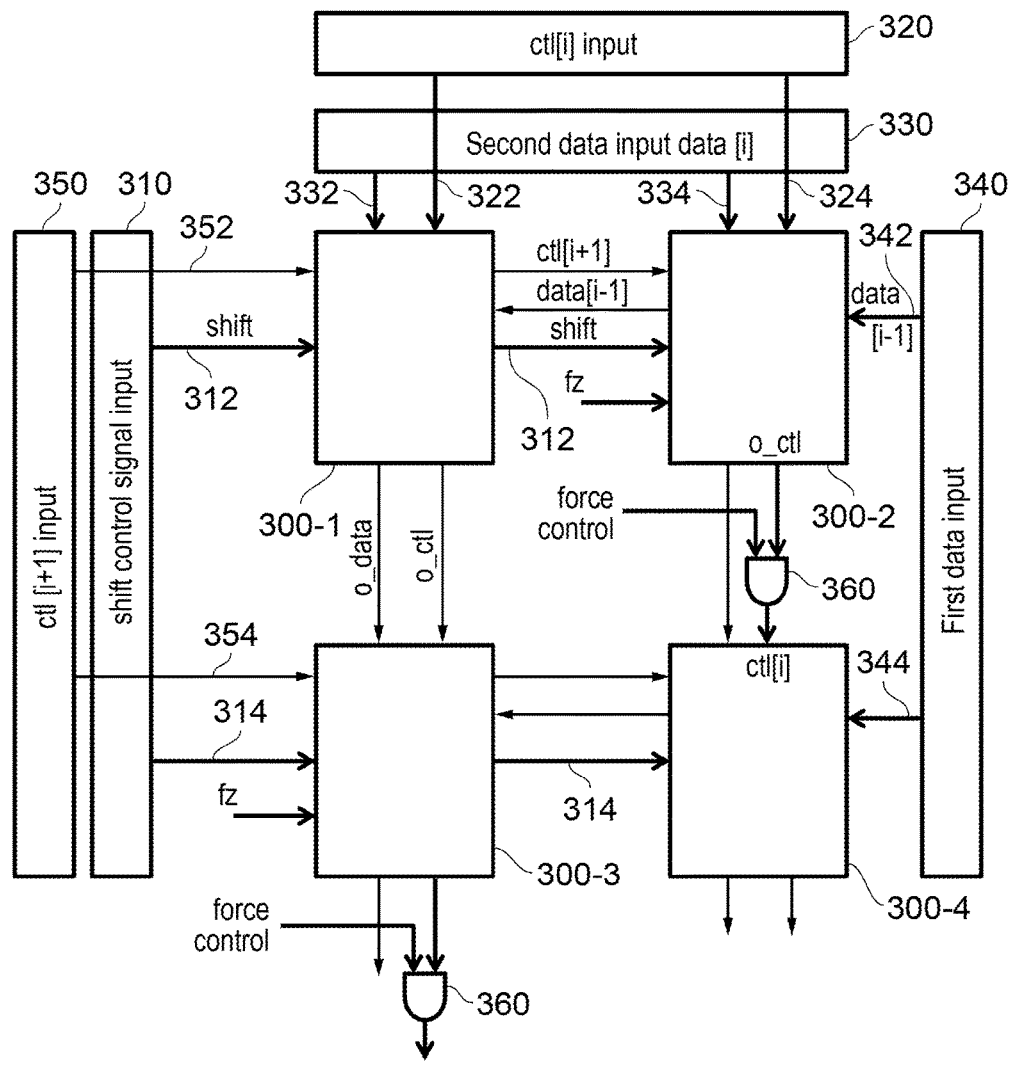
FIG. 3 schematically illustrates a set of bit processing circuitries.

FIG. 3 schematically illustrates an arrangement to interconnect the bit processing circuitries of FIG. 2 in a generic manner allowing various examples of functionality, such as examples to be discussed below, to be performed.

Various inputs are provided to the bit processing circuitries 300-1, 300-2, 300-3, 300-4, each of which can be of the form described with respect to FIG. 2 above. In some example functionalities to be discussed below, not all of these inputs are used, such that for example unused ones may be set to a predetermined value or disabled. This will be discussed further below.

The simplified example arrangement of FIG. 3 provides two instances of bitwise processing of an ordered bit array two bits wide. So, the bit processing circuitries 300-1, 300-2 provide a first instance of bitwise processing and the bit processing circuitries 300-3, 300-4 provide a second instance.

A shift control signal input 310 provides respective shift control bits 312, 314 to the instances of bitwise processing. The shift signal 312 is provided to the bit processing circuitries 300-1 and 300-2. The shift signal 314 is provided to the bit processing circuitries 300-3 and 300-4.

In some examples, such as that shown here, the ordered bit array comprises an n-bit array (a two bit array in this example, but other values such as eight bit, sixteen bit, thirty-two bit or the like could be used); the circuitry provides n successive instances of bitwise processing (two instances in this example, but in other examples the same number of instances as there are bit positions in the n-bit array; more generally n might be an integer equal to one or more, for example 4, 8, 16, 32, 64 or the like, though it is not a requirement that powers of two are used) and the circuitry is responsive to an n-bit shift control bit array, for example implemented by the shift control signal input, in which a respective bit of the n-bit shift control bit array provides a bit shift control signal to a respective instance of bitwise processing.

In other words, for input data having a certain bit depth or number of bits, such as n bits, there are n instances of bitwise processing, and each instance has a respective shift control signal which can be provided in the example of FIG. 3 by the shift control signal input, for example implemented as a buffer or latch.

In the example discussed above with respect to FIG. 2, various signals are passed between adjacent bit processing circuitries, either being adjacent within a particular instance of bitwise processing (left-to-right, as drawn) or being in a corresponding column but in a previous or next instance of bitwise processing. However, for the first bit processing circuitry in any direction of data value transfer, input signals can be provided in place of those which would otherwise be passed to that bit processing circuitry from a preceding bit processing circuitry.

For example, the values data [i] and ctl [i] are obtained, for any bit processing circuitry other than a bit processing circuitry in the first instance of bitwise processing, from a bit processing circuitry at the corresponding bit position in a preceding instance of bitwise processing. In the example of FIG. 3, for the first instance of bitwise processing (300-1, 300-2) these signals can instead be provided by a ctl [i] input 320 and a second data input 330. The ctl [i] input 320 provides ctl [i] values 322, 324 to the bit processing circuitries 300-1, 300-2. The second data input 330 provides data [i] values 332, 334 to the bit processing circuitries 300-1, 300-2.

The value data [i−1] is normally provided by a next bit processing circuitry to the right as drawn, or in other words an earlier bit processing circuitry in the first direction. But for the extreme right-most bit processing circuitries 300-2, 300-4, no such next-earlier bit processing circuitry exists, and so a first data input 340 provides values of data [i−1] 342, 344 to the bit processing circuitries 300-2, 300-4 respectively.

Finally, the signal ctl [i+1] is normally provided from an earlier bit processing circuitry in the second direction, but for the bit processing circuitries 300-1, 300-3, no such earlier bit processing circuitry exists and so a ctl [i+1] input 350 provides values of ctl [i+1] 352, 354 to the bit processing circuitries 300-1, 300-3 respectively.

The circuitry therefore has a first data input 340 configured to provide respective bits of a first input ordered bit array to respective first inputs of bit processing circuitries earliest in the first direction applying respective instances of bitwise processing; and a second data input 330 configured to provide respective bits of a second input ordered bit array to respective first inputs of a series of bit processing circuitries applying a first instance of bitwise processing.

Other signals are passed between adjacent bit processing circuitries using the arrangements discussed with respect to FIG. 2.

Two other input signals are shown in FIG. 3.

The force zero (fz) signal is provided to bit processing circuitries on a leading diagonal as drawn, which is to say, the bit processing circuitries 300-2, 300-3 in FIG. 3. In the example shown, the leading diagonal starts at the earliest bit processing circuitry (in the first direction) of the earliest instance of bitwise processing (that is to say the bitwise processing circuitry 300-2) and, with each successive instance of bitwise processing, advances by one bit position in the first direction. Each of the other bit processing circuitries may include the AND gate 260, but its fz input may be tied to 0 so that it has no substantive effect on the output value o_data.

As shown in FIG. 15 discussed below, the fz signal is set to 1 in a BDEP operation (discussed below) for a cell (by logic, not shown) if and only if shift=1, ctl [i+1]=1 and ctl [i]=0. Also as discussed below, the fz arrangement is optional.

Another input, again applying to bit processing circuitries on the leading diagonal, is a "force control" input to an AND gate 360. By setting the force control signal to a 0, then regardless of what the value of o_ctl was, from the preceding instance of bitwise processing at that bit position, the value of ctl [i] supplied to the next instance at that bit position will be 0. As discussed above, once the ctl [i] value is 0 in any column (as drawn), all successive bit processing circuitries in that column will be inhibited from shifting. All of the force control signals may be tied to a single control input so that they are collectively either a 1 or a 0. The operation of the force control signal will be discussed below.

Various example arrangements using the circuitry of FIG. 3 will be discussed below. The example arrangements can use a common circuitry (a set of interconnected bit processing circuitries as discussed above) to perform at least three example bit-level permutation instructions BEXT, BDEP, and BGRP, depending on configuration information, which are defined as follows:

BDEP: data bits (from least to most significant) are deposited into the output according to the contents of sieve. For each so-called sieve bit, if sieve=1, a data bit is deposited into output. Otherwise, the output bit is set to 0. This procedure is repeated for all sieve bits.

BEXT: data bits located in positions indicated by active sieve bits are extracted and copied in order to the least significant bits in the output.

BGRP: data bits located in positions indicated by active sieve bits are extracted from data and copied to the least significant bits in the output. In addition, data bits located in positions indicated by inactive sieve bits are extracted from data and copied to the adjacent free output bits.

In these bit permutation instructions, different input data bits are shifted by different amounts depending on the values of the sieve bits. For example, executing BDEP using the 8-bit sieve 8'b1011_0101 and the 8-bit data string 'abcd_efgh' results in 'd0ef_0g0h', where bit 'd' in the data has shifted 3 places to the left, bits 'e' and 'f' have shifted 2 places to the left, bit 'g' by 1 place to the left, and bit 'h' by no places. Executing BEXT, using the same sieve and data, results in '000a_cdfh' where bit 'a' in the data has shifted 3 places to the right, bits 'c' and 'd' have shifted 2 places to the right, bit 'f' by 1 place to the right, and bit 'h' by no places. Executing BGRP, with the same sieve and data, results in 'bega_cdfh', where bits 'b', 'e' and 'g' have all shifted left by different amounts and the other data bits have shifted right in accordance with BEXT.

Each instance of bitwise processing in the discussion below performs the processing associated with a respective sieve bit.

A first example arrangement relates to implementation of a bit-level permutation operation referred to as BEXT.

In the BEXT arrangement, the circuitry is configured to generate an n-bit output ordered bit array in which bits of an n-bit input ordered bit array at bit positions of active bits of an n-bit shift control bit array are provided, starting from an earliest bit position in the n-bit output ordered bit array. In other words, data bits at positions indicated by active "sieve" bits (discussed below) are extracted and copied in order to the least significant bits in the output.

To discuss this further, FIG. 4 provides a schematic diagram illustrating the effective operation of the bit processing circuitry in this arrangement; FIG. 5 schematically illustrates some of the signals utilised by a set of 4×4 bit processing circuitries (though for clarity, it does not show every signal transfer to and from the bit processing circuitries) and FIG. 6 illustrates a schematic example of the operation of this example bit permutation instruction for an example using 8 bits and 8 instances.

The ctl [i] input 320 is arranged so that all of the input values of ctl [i] for the first instance 500 of bitwise processing are set to ctl [i]=1. Similarly, the ctl [i+1] input 350 is set so that all input values of ctl [i+1] are equal to 1. The shift control signal 310 comprises respective bits of an n-bit shift control bit array (where n is 4 in the schematic example shown in FIG. 5). The first data input 340 provides respective bits of an n-bit input ordered bit array. The second data input 330 is not used in this example, for example by setting all of its bits to 0.

Returning to FIG. 4, because all of the ctl [i] and ctl [i+1] signals are set to 1, only values of 1 can propagate as o_ctl, and so no shift inhibition or locking takes place at all. Therefore, shifting either takes place or does not take place, purely under the control of the respective bits of the shift control signal. Therefore, a simplified version of the circuitry of FIG. 2 is illustrated in FIG. 4 in which components which have no substantive effect (by virtue of the state of the ctl [i] and ctl [i+1] signals) are omitted. Note that these components are not physically omitted from the circuitry but simply have no substantive effect under the influence of the particular values of control signals applied in FIG. 5.

FIG. 6 provides an example of the operation of the circuitry of FIG. 5 to implement BEXT operation, but in the example shown, and 8×8 array of bit processing circuitries are provided to allow for eight instances of 8-bit processing. Here, the 8-bit shift control bit array is referred to as "sieve" [7:0] and the 8-bit input ordered bit array provided by the first data input 340 is represented by bits abcdefgh (where each of a . . . h represents an arbitrary example value of 1 or 0). The instances of bitwise processing at which the bits a . . . h would be input by the input 340 (if FIG. 5 were an 8×8 array) are shown schematically in FIG. 5. The output of the circuitry of FIG. 5 at each instance of bitwise processing is referred to as data [7:0].

The eight sieve bits each correspond to, and act as shift control bits for, respective instances of bitwise processing; a first sieve bit 600 provides shift control for a first instance of bitwise processing (a top row in the representation use in FIG. 5) and a last bit of the sieve value 610 does so for a final instance of bitwise processing (the bottom row in the type of representation used in FIG. 5). The respective data values represent the output at each instance of bitwise processing, with the data values at the bottom row of FIG. 6 representing a final output 510 of the circuitry of the type shown in FIG. 5.

At each row of FIG. 6, each row corresponding to an instance of bitwise processing, a shift left takes place if the respective sieve value is 0. In terms of the right hand column 620, corresponding to the right hand column of bit processing circuitries in the type of arrangement shown in FIG. 5, if a shift takes place, it will cause the input from the first data input 340 of the corresponding bit of the input ordered bit array for that instance of bitwise processing. So, looking at the top row of FIG. 6, a first bit ("a") of the input ordered bit array from the first data input is shifted left into the first bit processing circuitry (in the first direction) of the first instance of bitwise processing. Other values are preset to 0, for example by the second data input 320, and so the value of 0 is simply shifted along the row for other bit processing circuitries.

In the second row of FIG. 6, a further shift left takes place so the value a is shifted to the second processing circuitry of that instance and the second bit of the input order bit array ("b") is shifted in to the first processing circuitry of that instance.

No shifting takes place in the third row because the sieve value is 0.

In the fourth row, the values a, b are shifted left and the fourth bit ("d") of the input ordered bit array is shifted from the first data input into the first bit position.

The procedure then continues using the same techniques to arrive at the final output shown by the final row 610.

In summary, therefore, in the BEXT operation, the first input ordered bit array at the first data input comprises an n-bit input ordered bit array; the second input ordered bit array at the second data input comprises an array of bits of a predetermined value; the one or more inhibit control signals supplied to each bit processing circuitry comprise signals indicating that shifting should be allowed; and the circuitry is configured to generate an n-bit output ordered bit array in which bits of the n-bit input ordered bit array at bit positions of active bits of the n-bit shift control bit array are provided, starting from an earliest bit position in the n-bit output ordered bit array.

Using a similar notation, FIGS. 7 to 9 schematically illustrate the operation of a so-called BGRP bit permutation operation, in which the circuitry performs a function of generating an n-bit output ordered bit array in which bits of a common n-bit input ordered bit array (to be discussed below) in bit positions of active bits of an n-bit shift control bit array are provided, starting from an earliest bit position in the n-bit output ordered bit array in the first direction followed in the first direction by remaining bits of the common n-bit input ordered bit array. In other words, data bits in positions indicated by active sieve bits are extracted and copied to the least significant bits of the output. In addition, data bits located in positions indicated by inactive sieve bits are extracted and copied to the adjacent free output bits.

Once again, FIG. 7 shows the active or effective components of the bit processing circuitry of FIG. 2, under the particular set of control signals and configuration used in FIG. 8. Other components are still physically present but have no substantive effect on the processing.

Referring to FIG. 8, which shows a schematic 4×4 array of bit processing circuitries, the ctl [i] input 320 is set so that all ctl [i] values are set to 1. The second data input 330 provides respective bits of the input ordered bit array, as does the first data input 340 (which is why the input ordered bit array is referred to as a common n-bit ordered bit array above, since the same bits are provided by the first data input 340 and the second data input 330). The shift control signal 310 provides respective shift or sieve bits, and the ctl [i+1] input 350 sets all ctl [i+1] values to 0. The instances of bitwise processing at which the bits a . . . h would be input by the input 340 and the input 330 (if FIG. 8 were an 8×8 array) are shown schematically in FIG. 8.

In brief, the effect of setting all the ctl [i+1] values to 0 is that at any instance of bitwise processing (a row as drawn in FIG. 8) where shift equals 0, o_ctl will be propagated as 0, which then becomes ctl [i+1] to the next column along.

In an example 8×8 implementation shown by the table of FIG. 9, an occurrence of a sieve value of 0 (for example in the third instance of bitwise processing represented by the third row of FIG. 9) causes the first column to be locked (because the ctl [i+1] values applied by the input 350 to the first column are all 0)). Locked values are indicated by an asterisk in this table and in FIG. 14 below.

At each subsequent instance of a sieve value of 0, a further column, starting from the left, is locked. In the meantime, those columns which are not locked, shifting takes place whenever the sieve value is 1 and, when a shift does take place, a next data bit of the input ordered bit array is input at the right-most bit processing circuitry.

In summary, in the BGRP operation, a third control input 350 provides respective bits of a third input ordered bit array to provide respective second inhibit control signals ctl [i+1] to bit processing circuitries earliest in the second direction applying respective instances of bitwise processing; in which: the first input ordered bit array at the first data input and the second input ordered bit array at the second data input comprise a common n-bit input ordered bit array; the third ordered bit array comprises an array of bits indicating that shifting should be inhibited; and the circuitry performs a function of generating an n-bit output ordered bit array in which bits of the common n-bit input ordered bit array at bit positions of active bits of the n-bit shift control bit array are provided, starting from an earliest bit position in the n-bit output ordered bit array in the first direction, followed in the first direction by remaining bits of the common n-bit input ordered bit array.

A further example mode of operation, relating to an example bit permutation instruction BDEP, is shown in FIGS. 10 to 13. Once again, FIG. 10 indicates the components of the circuitry of FIG. 2 which make a substantive contribution to the processing in this operation.

As represented schematically in FIG. 11, a broken vertical line in FIG. 12 represents the use, on the outputs of bit processing circuitries on the leading diagonal as discussed above, of the force control gates 360. (Note that these gates can be present in the circuitries of FIGS. 5 and 8 but their function is disabled by setting force control to 1).

In the BDEP permutation operation, the circuitry is configured to generate an output n-bit ordered bit array in which bits of an n-bit input ordered bit array at bit positions of active bits of the n-bit function control bit array are provided, starting from an earliest bit position in the n-bit ordered bit array and other bits of the output n-bit ordered bit array are set to a predetermined value such as 0. In other words, data bits (from least to most significant) are deposited into the output according to the contents of the sieve. For each sieve bit, if sieve=1, a data bit is deposited into the output. Otherwise the output bit is set to 0.

The input 350 sets all values of ctl [i+1] to 1. The input 320 sets all values of ctl [i] to 0 except for the earliest bit processing circuitry in the first direction. The input 330 carries the input bits (the order of which is indicated schematically in FIG. 12). The input 340 is not used. The force control bits signals are all set to 0. The force zero (fz) signals are all set to 1.

The input 310 carries shift bits which, in this example, are a bit-inverted and bit-reversed version of the sieve bits. So, in the example of FIG. 13, sieve[7:0]=11010001, and shift [7:0]=NOT (sieve[0:7])=01110100. The bit inversion and bit reversal can be performed by logic circuitry 1200.

At each instance (row in FIG. 13) another column, starting from the right, is locked (by the force control gates 360 on the outputs of the leading diagonal bit processing circuitries forcing o_ctl to 0). The force zero on the leading diagonal sets data values to zero unless the column is already locked. This is achieved, as mentioned above, by the fz signal being set to 1 in a BDEP operation (discussed below) for a cell (by logic, not shown) if and only if shift=1, ctl [i+1]=1 and ctl [i]=0.

In summary, in a BDEP operation, control circuitry can provide respective first inhibit control signals (the output of the AND gates 360), to indicate that bit shifting should be inhibited, to a bit processing circuitry at a selected position for each instance of bitwise processing, the selected position advancing in the second direction between the successive instances of bitwise processing; and the second input ordered bit array at the second data input comprises an n-bit input ordered bit array. The circuitry can comprise generator circuitry 1200 to generate the n-bit shift control bit array (shift) by inverting and bit-reversing an n-bit function control bit array (sieve); and processing circuitry 260 or 1400 to generate an output n-bit ordered bit array by setting any output bits to a first predetermined value at bit positions for which a bit of the n-bit function control bit array is inactive. The circuitry can be configured to generate the output n-bit ordered bit array in which bits of the n-bit input ordered bit array at bit positions of active bits of the n-bit function control bit array are provided, starting from an earliest bit position in the n-bit input ordered bit array; and other bits of the output n-bit ordered bit array are set to the first predetermined value.

Figure 14:
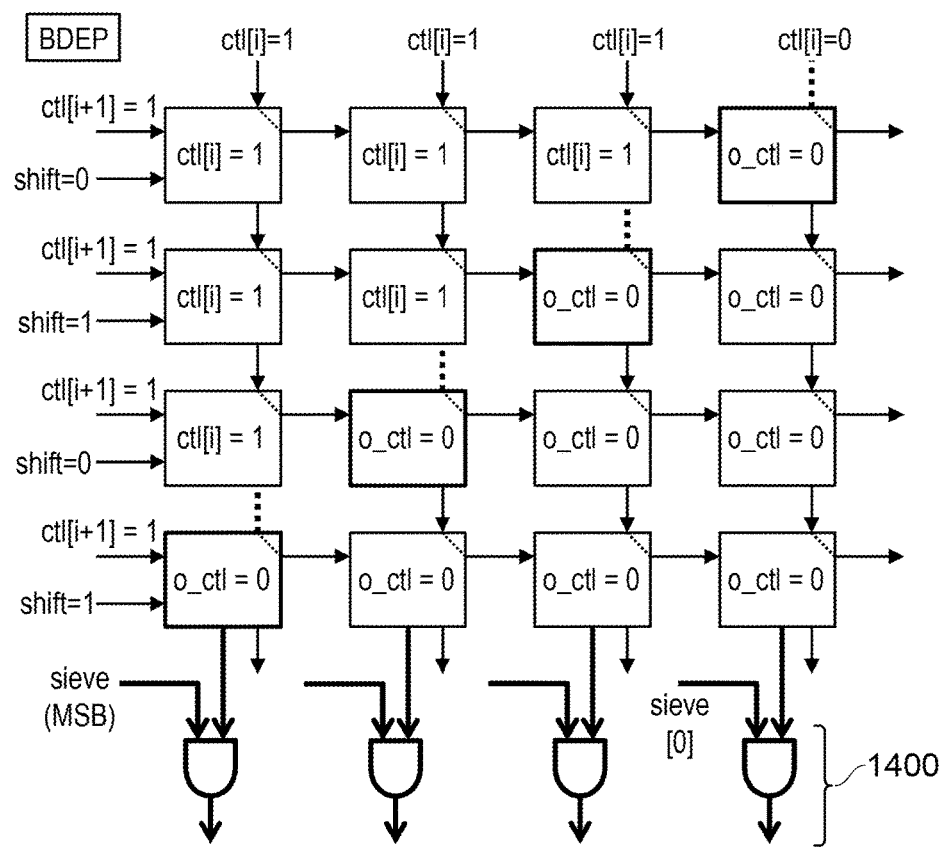
FIG. 14 schematically illustrates an alternative force zero arrangement.

In place of the fz function and the AND gate 260, an array of AND gates 1400 in FIG. 14 can be used to selectively set output data bits of the array of FIG. 8 (although modified so as not to use the fz function) to 0 where corresponding sieve bits are 0. So each AND gate is responsive to a corresponding sieve (not shift) bit.

FIG. 15 schematically illustrates an example table showing, for the bit processing circuitry of FIG. 2, possible values of o_ctl and fz in the case of the three permutation instructions BEXT, BGRP and BDEP for various values of shift, ctl [i+1] and ctl [i]. An "X" indicates that this set of values is not possible or not allowed for that particular permutation operation.

FIGS. 16 and 17 schematically illustrate a set of instances of bitwise processing being performed by a smaller number of physical series of bit processing circuitries.

FIG. 16 illustrates the general principle, in that for bit processing circuitries in a series 1600 providing an instance of bitwise processing, output signals such as o_data and o_ctl can be routed back as inputs data [i] and ctl [i] (for example by multiplexers, not shown, so that an initial input 1610, 1620 can still be provided for a first instance of bitwise processing). In this way, by circuitry linking the output to the input, a single series of bit processing circuitries can perform two or more instances of bitwise processing.

More generally, in place of the single series 1600, two or more series can be provided, with the last output being routed back under control of one or more multiplexers to the first inputs, so that a smaller number of series of bit processing circuitries can collectively perform a larger number of instances of bitwise processing.

Referring to FIG. 17, due to the cell-based design of the bit processing circuitry, the array may be made as large or as small as required. In addition, the design also allows for subword processing (where a subword is a subset of the bits of an ordered bit array).

For example, consider a 16×8 block or array of cells, illustrated in FIG. 17, made from two 8×8 square sub-blocks 1700, 1710 of bit processing circuitries of FIG. 2. This block could process two bytes (two sets of 8 bits) of data in parallel or it could process one halfword (16 bits) of data in two iterations. For halfword operation, shift [15:8] would be broadcast across both blocks then shift [7:0] in the next iteration; for byte operation, however, shift [15:8] would be applied to block 1 and shift [7:0] to block 0.

Also, the ctl [i+1] signals that straddle the two blocks are multiplexed between the ctl bits emerging from the right-hand edge of block 1 (halfword) or 0's or 1's depending on which permutation was being executed. Similarly, data bits would be fed from the left-hand edge of Block 0 into the right-hand edge of Block 1 for halfword processing and multiplexed in with 0's (for BDEP) or data [15:8] (not shown in FIG. 17). For halfword operation, the o_data and o_ctl bits would be fed back from the bottom of the two blocks as drawn and multiplexed in at the top of the two blocks for all element sizes larger than a byte.

This type of arrangement can provide flexibility: a CPU might instance a large number of cells in several 8×8 or 16×16 blocks in order to achieve high performance and lower latency, or it might instance a small number of cells in, for example, 8×4 or 16×4 blocks for lower performance but lower power.

Figure 18:
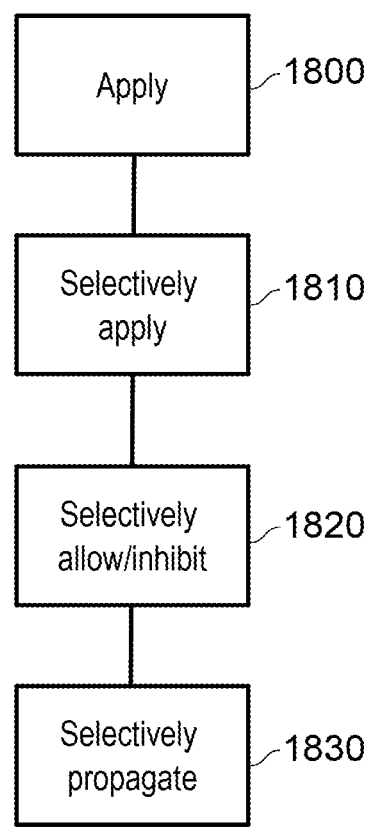
FIG. 18 is a schematic flowchart illustrating a method.

Finally, FIG. 18 is a schematic flowchart illustrating a method comprising:

applying (at a step 1800), using a set of bit processing circuitries, two or more successive instances of bitwise processing to an ordered bit array;

for a given bit position within the ordered bit array, each bit processing circuitry:

selectively applying (at a step 1810) a bit shift of a respective input bit to a next bit processing circuitry in a first direction relative to the ordered bit array, in response to an active state of a bit shift control signal and not applying the bit shift in response to an inactive state of the bit shift control signal;

selectively allowing or inhibiting (at a step 1820) a bit shifting operation in response to one or more inhibit control signals; and selectively propagating (at a step 1830) an output inhibit control signal, indicating that a bit shifting operation should be inhibited, as an inhibit control signal to bit processing circuitry applying a next instance of the bitwise processing at the given bit position, in dependence upon the bit shift control signal and the one or more inhibit control signals.

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device (such as a processing element as discussed above) may be programmed to perform the function. "Configured to" does not imply that the apparatus element needs to be changed in any way in order to provide the defined operation.

Although illustrative embodiments of the present techniques have been described in detail herein with reference to the accompanying drawings, it is to be understood that the present techniques are not limited to those precise embodiments, and that various changes, additions and modifications can be effected therein by one skilled in the art without departing from the scope and spirit of the techniques as defined by the appended claims. For example, various combinations of the features of the dependent claims could be made with the features of the independent claims without departing from the scope of the present techniques.

We claim:

1. Circuitry comprising:
   a set of bit processing circuitries to apply two or more successive instances of bitwise processing to an ordered bit array;
   each bit processing circuitry for a given bit position within the ordered bit array comprising:
   bit shifting circuitry to selectively apply a bit shift of a respective input bit to a next bit processing circuitry in a first direction relative to the ordered bit array, in response to an active state of a bit shift control signal, the bit shifting circuitry not applying the bit shift in response to an inactive state of the bit shift control signal; and
   bit shift control circuitry to selectively allow or inhibit a bit shifting operation in response to one or more inhibit control signals;
   in which:
   the bit shift control circuitry is configured to selectively propagate an output inhibit control signal, indicating that a bit shifting operation should be inhibited, as an inhibit control signal to bit processing circuitry applying a next instance of the bitwise processing at the given bit position, in dependence upon the bit shift control signal and the one or more inhibit control signals.

2. Circuitry according to claim 1, in which the one or more inhibit control signals comprise:
   a first inhibit control signal, the bit shift control circuitry being configured to inhibit bit shifting by the bit shifting circuitry and to propagate the output inhibit control signal, indicating that a bit shifting operation should be inhibited, when the first inhibit control signal indicates that a bit shifting operation should be inhibited; and
   a second inhibit control signal, the bit shift control circuitry being configured to propagate the output inhibit control signal, indicating that a bit shifting operation should be inhibited, when the second inhibit control signal indicates that a bit shifting operation should be inhibited and the bit shift control signal is inactive.

3. Circuitry according to claim 2, in which the second inhibit control signal is dependent upon the first inhibit control signal of another bit shifting circuitry for a bit position adjacent, in a second direction relative to the ordered bit array, to the given bit position.

4. Circuitry according to claim 3, in which the second direction is an opposite direction, relative to the ordered bit array, to the first direction.

5. Circuitry according to claim 2, in which the set of bit shifting circuitries comprises:
   a series of bit shifting circuitries to apply a given instance of bitwise processing, the series of bit shifting circuitries being responsive to a common bit shift control signal applicable to the given instance of bitwise processing.

6. Circuitry according to claim 5, comprising circuitry to link an output of a given series of bit processing circuitries to an input of the given series of bit processing circuitries, so as to control the given series of bit processing circuitries to provide two or more instances of bitwise processing.

7. Circuitry according to claim 5, comprising two or more successive series of bit processing circuitries.

8. Circuitry according to claim 7, comprising n successive series of bit processing circuitries to perform n successive instances of bitwise processing.

9. Circuitry according to claim 5, in which:
   the ordered bit array comprises an n-bit array;
   the circuitry provides n successive instances of bitwise processing;
   the circuitry is responsive to an n-bit shift control bit array, in which a respective bit of the n-bit shift control bit array provides a bit shift control signal to a respective instance of bitwise processing.

10. Circuitry according to claim 9, in which each bit processing circuitry for a given bit position in the ordered bit array comprises:
    a first bit input;
    a second bit input; and
    a bit output, to output either a bit received at the first bit input, in the case that a bit shift is not performed, or a bit received at the second bit input, in the case that a bit shift is performed.

11. Circuitry according to claim 10, in which, for each given bit processing circuitry other than a bit processing circuitry earliest in the series in the first direction, a bit at the second bit input is dependent upon a bit at the first bit input of an adjacent bit processing circuitry earlier in the series in the first direction.

12. Circuitry according to claim 10, in which, for an instance of bitwise processing other than a first instance of bitwise processing, the first bit input for a bit processing circuitry at a given bit position is configured to receive a bit output by a bit processing circuitry at the given bit position applying a previous instance of bitwise processing.

13. Circuitry according to claim 12, comprising:
    a first data input configured to provide respective bits of a first input ordered bit array to respective first inputs of bit processing circuitries earliest in the first direction applying respective instances of bitwise processing; and
    a second data input configured to provide respective bits of a second input ordered bit array to respective first inputs of a series of bit processing circuitries applying a first instance of bitwise processing.

14. Circuitry according to claim 13, in which:
    the first input ordered bit array comprises an n-bit input ordered bit array;
    the second input ordered bit array comprises an array of bits of a predetermined value;
    the one or more inhibit control signals supplied to each bit processing circuitry comprise signals indicating that shifting should be allowed; and
    the circuitry is configured to generate an n-bit output ordered bit array in which bits of the n-bit input ordered bit array at bit positions of active bits of the n-bit shift control bit array are provided, starting from an earliest bit position in the n-bit output ordered bit array.

15. Circuitry according to claim 13, comprising:
a third control input to provide respective bits of a third input ordered bit array to provide respective second inhibit control signals to bit processing circuitries earliest in the second direction applying respective instances of bitwise processing;
in which:
the first input ordered bit array and the second input ordered bit array comprise a common n-bit input ordered bit array;
the third ordered bit array comprises an array of bits indicating that shifting should be inhibited;
the circuitry performs a function of generating an n-bit output ordered bit array in which bits of the common n-bit input ordered bit array at bit positions of active bits of the n-bit shift control bit array are provided, starting from an earliest bit position in the n-bit output ordered bit array in the first direction, followed in the first direction by remaining bits of the common n-bit input ordered bit array.

16. Circuitry according to claim 13, comprising:
control circuitry to provide respective first inhibit control signals, to indicate that bit shifting should be inhibited, to a bit processing circuitry at a selected position for each instance of bitwise processing, the selected position advancing in the second direction between the successive instances of bitwise processing;
in which the second input ordered bit array comprises an n-bit input ordered bit array.

17. Circuitry according to claim 16, comprising:
generator circuitry to generate the n-bit shift control bit array by inverting and bit-reversing an n-bit function control bit array; and
processing circuitry to generate an output n-bit ordered bit array by setting any output bits to a first predetermined value at bit positions for which a bit of the n-bit function control bit array is inactive;
the circuitry being configured to generate the output n-bit ordered bit array in which:
bits of the n-bit input ordered bit array at bit positions of active bits of the n-bit function control bit array are provided, starting from an earliest bit position in the n-bit input ordered bit array; and
other bits of the output n-bit ordered bit array are set to the first predetermined value.

18. Circuitry according to claim 1, in which the bit processing circuitries are identical to one another.

19. Circuitry comprising:
a set of bit processing means for applying two or more successive instances of bitwise processing to an ordered bit array;
each bit processing means for a given bit position within the ordered bit array comprising:
bit shifting means for selectively applying a bit shift of a respective input bit to a next bit processing means in a first direction relative to the ordered bit array, in response to an active state of a bit shift control signal, the bit shifting means not applying the bit shift in response to an inactive state of the bit shift control signal; and
bit shift control means to selectively allow or inhibit a bit shifting operation in response to one or more inhibit control signals;
in which:
the bit shift control means is configured to selectively propagate an output inhibit control signal, indicating that a bit shifting operation should be inhibited, as an inhibit control signal to bit processing means applying a next instance of the bitwise processing at the given bit position, in dependence upon the bit shift control signal and the one or more inhibit control signals.

20. A method comprising:
applying, using a set of bit processing circuitries, two or more successive instances of bitwise processing to an ordered bit array;
for a given bit position within the ordered bit array, each bit processing circuitry:
selectively applying a bit shift of a respective input bit to a next bit processing circuitry in a first direction relative to the ordered bit array, in response to an active state of a bit shift control signal and not applying the bit shift in response to an inactive state of the bit shift control signal;
selectively allowing or inhibiting a bit shifting operation in response to one or more inhibit control signals; and
selectively propagating an output inhibit control signal, indicating that a bit shifting operation should be inhibited, as an inhibit control signal to bit processing circuitry applying a next instance of the bitwise processing at the given bit position, in dependence upon the bit shift control signal and the one or more inhibit control signals.

* * * * *